(12) United States Patent
Woody et al.

(10) Patent No.: US 9,537,099 B2
(45) Date of Patent: *Jan. 3, 2017

(54) COMPOSITIONS AND APPLICATIONS OF THREE COMPONENT BENZO[1,2-B:4,5-B] DITHIOPHENE-THIENOTHIOPHENE RANDOMLY SUBSTITUTED POLYMERS FOR ORGANIC SOLAR CELLS

(71) Applicant: PHILLIPS 66 COMPANY, Houston, TX (US)

(72) Inventors: Kathy Woody, Bartlesville, OK (US); Hui Huang, Beijing (CN); Ting He, Bartlesville, OK (US)

(73) Assignee: Phillips 66 Company, Houston, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/722,409

(22) Filed: May 27, 2015

(65) Prior Publication Data
US 2015/0349258 A1 Dec. 3, 2015

Related U.S. Application Data

(60) Provisional application No. 62/005,178, filed on May 30, 2014.

(51) Int. Cl.
  *C08G 75/00* (2006.01)
  *H01L 51/00* (2006.01)
  *H01L 51/42* (2006.01)

(52) U.S. Cl.
  CPC ....... *H01L 51/0036* (2013.01); *H01L 51/0043* (2013.01); *H01L 51/4253* (2013.01); *Y02E 10/549* (2013.01)

(58) Field of Classification Search
  CPC ............. H01L 51/0036; H01L 51/0047; C08G 2261/3243; C08G 2261/414; C08G 2261/124; C08G 2261/91
  See application file for complete search history.

(56) References Cited

U.S. PATENT DOCUMENTS 8,436,134 B2   5/2013   Yu et al.
8,653,228 B2   2/2014   Yu et al.
(Continued)

OTHER PUBLICATIONS

Thieno[3,2-b]thiophene-Substituted Benzo[1,2-b:4,5-b'] dithiophene as a Promising Building Block for Low Badgap Semi-conducting Polymers for High-Performance Single and Tandem Organic Photovoltaic Cells, Chemistry of Materials, Jan. 2014, vol. 26, pp. 1234-1242.

(Continued)

*Primary Examiner* — Shane Fang
(74) *Attorney, Agent, or Firm* — Phillips 66 Company

(57) ABSTRACT

A polymer having two different sets of repeat units consisting essentially of:

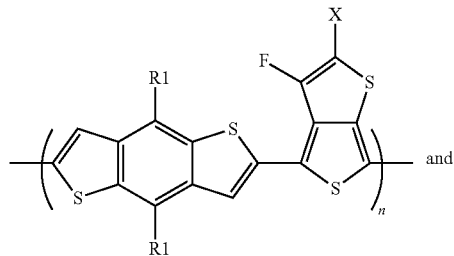

and

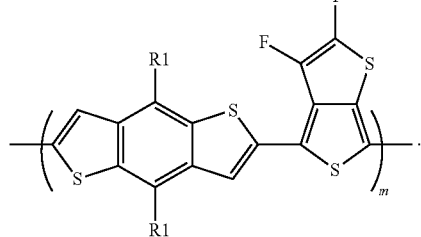

Additionally, in the polymer R1 can be selected from the group consisting of alkyl group, alkoxy group, aryl groups and combinations thereof. In the polymer, n and m can be greater than 1.

(Continued)

Current-voltage diagram of the 9.46% PCE P(BDT-FTT(P50)) solar cell.

In the polymer, x and y can be different from each other and independently selected from the group consisting of: an alkoxy group, a substituted alkoxy group, an aryl group, an alkyl group, a substituted alkyl group,

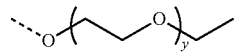

where y=1-3,

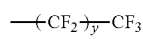

where y=0-12,

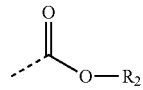

where R2 is selected from the group consisting of H, alkyl groups, and aryl groups,

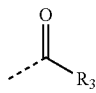

where R3 is selected from the group consisting of H, alkyl groups, and aryl groups,

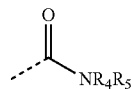

where R4 and R5 are independently selected from the group consisting of H, alkyl groups, and aryl groups, —$NR_6R_7$ where R6 and R7 are independently selected from the group consisting of H, alkyl groups, and aryl groups.

11 Claims, 1 Drawing Sheet

(56) References Cited

U.S. PATENT DOCUMENTS

| | | | |
|---|---|---|---|
| 8,703,960 B2 | 4/2014 | Huang | |
| 8,895,751 B2 | 11/2014 | Huang | |
| 2012/0279568 A1* | 11/2012 | Choi | H01L 51/0036 136/263 |
| 2013/0056071 A1 | 3/2013 | Palkar et al. | |
| 2013/0214213 A1 | 8/2013 | Wang et al. | |
| 2014/0042371 A1 | 2/2014 | Blouin et al. | |
| 2014/0151657 A1 | 6/2014 | Wang et al. | |
| 2014/0221590 A1 | 8/2014 | Woody et al. | |
| 2015/0136224 A1 | 5/2015 | Shi et al. | |
| 2015/0210800 A1 | 7/2015 | Wang et al. | |

OTHER PUBLICATIONS

PCT Notification of Transmittal of the International Search Report and the Written Opinion of the International Searching Authority or the Declaration, International Application No. PCT/US15/32813, International Filing Date: May 28, 2015, 9 pages.

\* cited by examiner

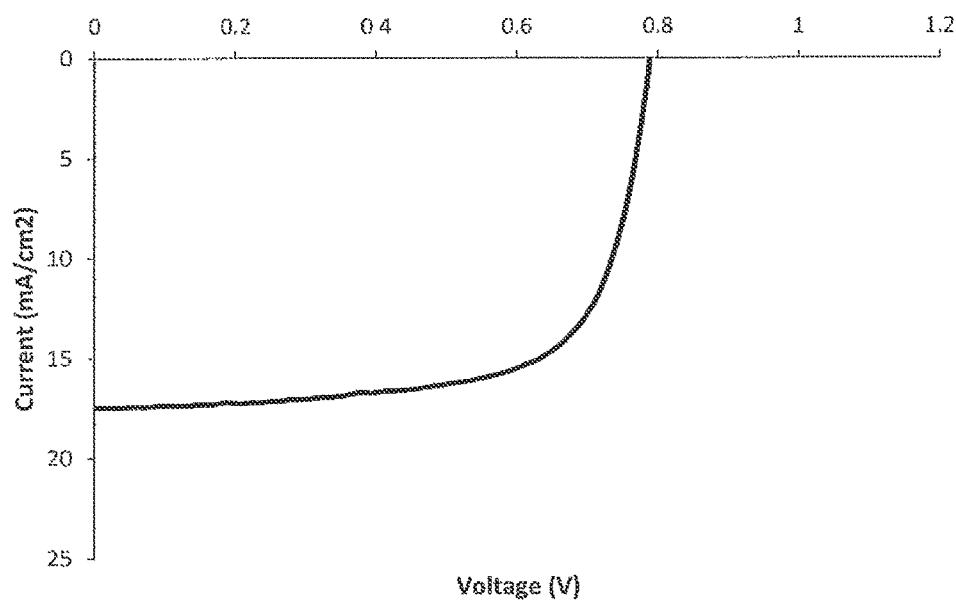
Current-voltage diagram of the 9.46% PCE P(BDT-FTT(P50)) solar cell.

COMPOSITIONS AND APPLICATIONS OF THREE COMPONENT BENZO[1,2-B:4,5-B] DITHIOPHENE-THIENOTHIOPHENE RANDOMLY SUBSTITUTED POLYMERS FOR ORGANIC SOLAR CELLS

CROSS-REFERENCE TO RELATED APPLICATIONS

This application is a non-provisional application which claims the benefit of and priority to U.S. Provisional Application Ser. No. 62/005,178 filed May 30, 2014, entitled "Compositions and Applications of Three Component Benzo[1,2-B:4,5-B]Dithiophene-Thienothiophene Randomly Substituted Conjugated Polymers for Organic Solar Cells," which is hereby incorporated by reference in its entirety.

STATEMENT REGARDING FEDERALLY SPONSORED RESEARCH OR DEVELOPMENT

None.

FIELD OF THE INVENTION

This invention relates to compositions and applications for a three component benzo[1,2-b:4,5-b]dithiophene-thienothiophene polymer.

BACKGROUND OF THE INVENTION

Solar energy using photovoltaic effect requires active semiconducting materials to convert light into electricity. Currently, solar cells based on silicon are the dominating technology due to their high conversion efficiency. Recently, solar cells based on organic materials showed interesting features, especially on the potential of low cost in materials and processing. Judging from the recent success in organic light emitting diodes based on a reverse effect of photovoltaic effect, organic solar cells are very promising.

Organic photovoltaic cells have many potential advantages when compared to traditional silicon-based devices. Organic photovoltaic cells are light weight, economical in the materials used, and can be deposited on low cost substrates, such as flexible plastic foils. However, organic photovoltaic devices typically have relatively low quantum yield (the ratio of photons absorbed to carrier pairs generated. This is, in part, thought to be due to the second order nature of the intrinsic photoconductive process. That is, carrier generation requires exciton generation, diffusion and ionization. The diffusion length of an exciton is typically much less than the optical absorption length, requiring a trade off between using a thick, and therefore resistive, cell with multiple or highly folded interfaces, or a thin cell with a low optical absorption efficiency.

Conjugated polymers are polymers containing π-electron conjugated units along the main chain. They can be used as active layer materials for some types of photo-electric devices, such as polymer light emitting devices, polymer solar cells, polymer field effect transistors, etc. As polymer solar cell materials, conjugated polymers should possess some properties, such as high mobility, good harvest of sunlight, good processibility, and proper molecular energy level. Some conjugated polymers have proven to be good solar cell materials. Conjugated polymers are made of alternating single and double covalent bonds. The conjugated polymers have a δ-bond backbone of intersecting $sp^2$ hybrid orbitals. The $p_z$ orbitals on the carbon atoms overlap with neighboring $p_z$ orbitals to provide π-bonds. The electrons that comprise the π-bonds are delocalized over the whole molecule. These polymers exhibit electronic properties similar to those seen in inorganic semiconductors. The semiconducting properties of the photovoltaic polymers are derived from their delocalized π bonds. The substituents of the polymers also largely influence the electronic properties. The optical bandgap, mobility and thin-film morphology are affected by both the type of functional group used as a substituent and the bulkiness and length of the side chain. Polymers which have only minor differences in the side chains will have large differences in the device performance.

There is a need in the art for polymer solar cells that exhibit increased solar conversion efficiency.

BRIEF SUMMARY OF THE DISCLOSURE

A polymer having two different sets of repeat units consisting essentially of:

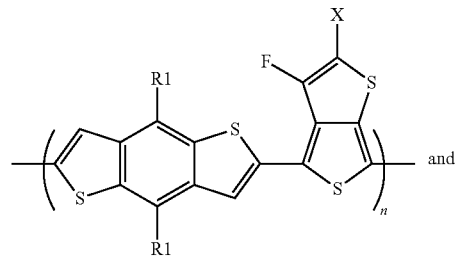

and

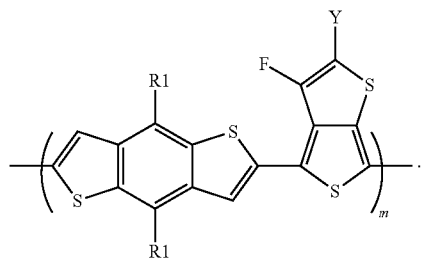

Additionally, in the polymer R1 can be selected from the group consisting of alkyl group, alkoxy group, aryl groups and combinations thereof. In the polymer, n and m can be greater than 1.

In the polymer, x and y can be different from each other and independently selected from the group consisting of: an alkoxy group, a substituted alkoxy group, an aryl group, an alkyl group, a substituted alkyl group,

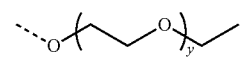

where y=1-3,

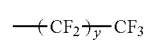

where y=0-12,

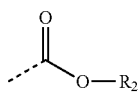

where R2 is selected from the group consisting of H, alkyl groups, and aryl groups,

where R3 is selected from the group consisting of H, alkyl groups, and aryl groups,

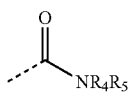

where R4 and R5 are independently selected from the group consisting of H, alkyl groups, and aryl groups, —NR₆R₇ where R6 and R7 are independently selected from the group consisting of H, alkyl groups, and aryl groups.

BRIEF DESCRIPTION OF THE DRAWINGS

A more complete understanding of the present invention and benefits thereof may be acquired by referring to the follow description taken in conjunction with the accompanying drawings in which:

FIG. 1 depicts a current-voltage diagram of a solar cell

DETAILED DESCRIPTION

Turning now to the detailed description of the preferred arrangement or arrangements of the present invention, it should be understood that the inventive features and concepts may be manifested in other arrangements and that the scope of the invention is not limited to the embodiments described or illustrated. The scope of the invention is intended only to be limited by the scope of the claims that follow.

"Alkyl," as used herein, refers to an aliphatic hydrocarbon chains. In one embodiment the aliphatic hydrocarbon chains are of 1 to about 100 carbon atoms, preferably 1 to 30 carbon atoms, more preferably, 1 to 20 carbon atoms, and even more preferably, 1 to 10 carbon atoms and includes straight and branched chains such as methyl, ethyl, n-propyl, iso-propyl, n-butyl, isobutyl, sec-butyl, t-butyl, n-pentyl, iso-pentyl, neo-pentyl, n-hexyl, and isohexyl. In this application alkyl groups can include the possibility of substituted and unsubstituted alkyl groups.

"Alkoxy," as used herein, refers to the group R—O— where R is an alkyl group of 1 to 100 carbon atoms. In this application alkoxy groups can include the possibility of substituted and unsubstituted alkoxy groups.

"Aryl" as used herein, refers to an optionally substituted, mono-, di-, tri-, or other multicyclic aromatic ring system having from about 5 to about 50 carbon atoms (and all combinations and subcombinations of ranges and specific numbers of carbon atoms therein), with from about 6 to about 10 carbons being preferred. Non-limiting examples include, for example, phenyl, naphthyl, anthracenyl, and phenanthrenyl. Aryl groups can be optionally substituted with one or with one or more Rx. In this application aryl groups can include the possibility of substituted aryl groups, bridged aryl groups and fused aryl groups.

The present embodiment describes a polymer with only two different sets of repeat units.

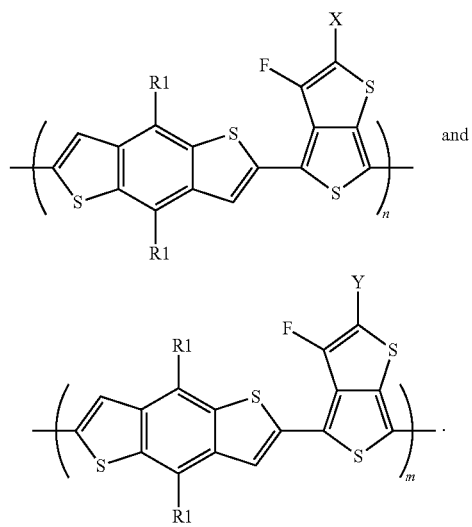

In this polymer R1 can be selected from alkyl groups, alkoxy groups and aryl groups and n and m are greater than 1. x and y are different from each other and independently selected from the group of: a) an alkoxy group, b) an aryl group, c) an alkyl group, d)

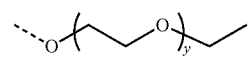

where y=1-3, e)

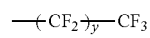

where y=0-12, f)

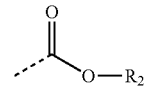

where R2 is selected from the group consisting of H, alkyl groups, and aryl groups f)

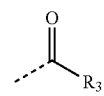

where R3 is selected from the group consisting of H, alkyl groups, and aryl groups, j)

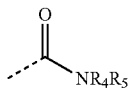

where R4 and R5 are independently selected from the group consisting H, alkyl groups, and aryl groups g) —NR$_6$R$_7$ where R6 and R7 are independently selected from the group consisting of H, alkyl groups, and aryl groups.

In one embodiment, the polymer is regio-random. In another embodiment the polymer is regio-regular.

In one embodiment, the two sets of repeat units can be a benzo[1,2-b:4,5-b']dithiophene with a 2-ethylhexyl substituted 3-fluorothieno[3,4-b]thiophene and a benzo[1,2-b:4,5-b']dithiophene with a propyl substituted 3-fluorothieno[3,4-b]thiophene. In another embodiment, the two sets of repeat units can be a benzo[1,2-b:4,5-b']dithiophene with a 2-ethylhexyl substituted 3-fluorothieno[3,4-b]thiophene and a benzo[1,2-b:4,5-b']dithiophene with a propyl substituted 3-fluorothieno[3,4-b]thiophene in a ratio of around 50:50. In yet another embodiment, the two sets of repeat units can be a 2-ethyl-1-(3-fluorothieno[3,4-b]thiophen-2-yl)hexan-1-one and a 1-(3-fluorothieno[3,4-b]thiophen-2-yl)butan-1-one in a ratio of around 50:50.

Typically, the number average molecular weight of the polymers is in the range of approximately 1000 to 1,000,000, with ideal polymers having a number average molecular weight in the range of about 5000 to 500,000, and some ideal polymers having a number average molecular weight in the range of approximately 20,000 to 200,000. It will be appreciated that molecular weight can be varied to optimize polymer properties and the inventions of the present disclosure cover all molecular weights. For example, lower molecular weight can ensure solubility, while a higher molecular weight can ensure good film-forming properties.

In one embodiment, the ratio of

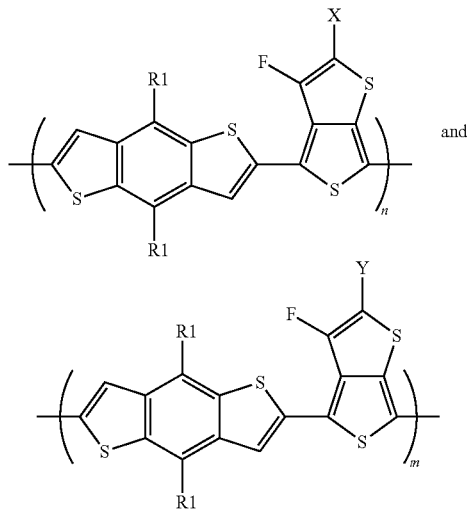

in the polymer is around 50:50.

The polymers produced from the present disclosure can be used as photovoltaic materials or active layer material in photovoltaic device or electronic devices such as photodetector devices, solar cell devices, and the like. Photovoltaic devices, including polymer solar cell devices or photodetector devices, are generally comprised of laminates of a suitable photovoltaic material between a hole-collecting electrode layer and an electron-collecting layer. Additional layers, elements or a substrate may or may not be present. Examples of electronic devices can be field effect transistors, light emitting devices, and sensors, electrochromic devices and capacitors

EXAMPLES

List of acronyms used:
BDT: Benzo[1,2-b:4,5-b']dithiophene
FTT: 3-Fluorothieno[3,4-b]thiophene
FTT(E): 2-ethylhexyl 3-fluorothieno[3,4-b]thiophene-2-carboxylate
FTT(P): propyl 3-fluorothieno[3,4-b]thiophene-2-carboxylate
FTT(M): methyl 3-fluorothieno[3,4-b]thiophene-2-carboxylate
FTT (K1): 2-ethyl-1-(3-fluorothieno[3,4-b]thiophen-2-yl)hexan-1-one
FTT (K2): 1-(3-fluorothieno[3,4-b]thiophen-2-yl)butan-1-one
PCE: power conversion efficiency
Jsc: short circuit current
Voc: open circuit voltage
PDI: polydispersity index
$M_n$: number average molecular weight defined by ($\Sigma$NiMi)/$\Sigma$Ni where Mi is the molecular weight of a chain and Ni is the number of chains of that molecular weight Soxhlet Extraction: The polymer is washed using a reflux apparatus with different solvents. The solvent and polymer is then heated till the solvent evaporates into a gas, then cools into a liquid. The solvent is then evaporated off and polymer products are produced.

Example 1

P(BDT-FTT(P)), (100% FTT(P)): Monomers BDT (0.228 g, 0.252 mmol) and FTT(P) (0.101 g, 0.251 mmol) were combined in a Schlenk flask with Pd(PPh$_3$)$_4$ (14 mg), toluene (10 mL) and dimethylformamide (4 mL). The solution was heated to 130° C. and stirred for 36 h. The solution was poured into 100 mL methanol and the polymer was collected by filtration. The polymer was purified by Soxhlet extraction by washing subsequently with acetone, hexanes and chloroform. The polymer was recovered in the chloroform fraction ($M_n$=40 kDa and PDI=2.08).

Example 2

P((BDT-FTT(P))$_{0.7}$-(BDT-FTT(E))$_{0.3}$), (70% FTT(P), 30% FTT(E)): Monomers distannyl-BDT (0.142 g, 0.157 mmol), dibromo-FTT(E) (0.022 g, 0.047 mmol) and dibromo-FTT(P) (0.044 g, 0.109 mmol) were combined in a Schlenk flask with Pd(PPh$_3$)$_4$ (12 mg), toluene (7 mL) and DMF (2.5 mL). The solution was heated to 130° C. and stirred for 24 h. The solution was poured into 100 mL methanol and the polymer was collected by filtration. The polymer was purified by Soxhlet extraction by washing subsequently with acetone, hexanes and chloroform. The polymer was recovered in the chloroform fraction ($M_n$=17 kDa and PDI=3.70).

Example 3

P((BDT-FTT(P))$_{0.5}$-(BDT-FTT(E))$_{0.5}$), (50% FTT(P), 50% FTT(E)): Monomers distannyl-BDT (0.108 g, 0.119 mmol), dibromo-FTT(E) (0.028 g, 0.059 mmol) and dibromo-FTT(P) (0.024 g, 0.059 mmol) were combined in a Schlenk flask with Pd(PPh$_3$)$_4$ (7 mg), toluene (6 mL) and DMF (2 mL). The solution was heated to 130° C. and stirred for 24 h. The solution was poured into 100 mL methanol and the polymer was collected by filtration. The polymer was purified by Soxhlet extraction by washing subsequently with acetone, hexanes and chloroform. The polymer was recovered in the chloroform fraction ($M_n$=34 kDa and PDI=3.17).

Example 4

P((BDT-FTT(P))$_{0.3}$-(BDT-FTT(E))$_{0.7}$), (30% FTT(P), 70% FTT(E)): Monomers distannyl-BDT (0.080 g, 0.088 mmol), dibromo-FTT(E) (0.029 g, 0.061 mmol) and dibromo-FTT(P) (0.011 g, 0.027 mmol) were combined in a Schlenk flask with Pd(PPh$_3$)$_4$ (5 mg), toluene (6 mL) and DMF (3 mL). The solution was heated to 130° C. and stirred for 36 h. The solution was poured into 100 mL methanol and the polymer was collected by filtration. The polymer was purified by Soxhlet extraction by washing subsequently with acetone, hexanes and chloroform. The polymer was recovered in the chloroform fraction ($M_n$=63 kDa and PDI=2.96).

Example 5

P((BDT-FTT(P))$_{0.1}$-(BDT-FTT(E))$_{0.9}$) (10% FTT(P), 90% FTT(E)): Monomers distannyl-BDT (0.093 g, 0.103 mmol), dibromo-FTT(E) (0.044 g, 0.093 mmol) and dibromo-FTT(P) (0.004 g, 0.010 mmol) were combined in a Schlenk flask with Pd(PPh$_3$)$_4$ (6 mg), toluene (6 mL) and DMF (2 mL). The solution was heated to 130° C. and stirred for 24 h. The solution was poured into 100 mL methanol and the polymer was collected by filtration. The polymer was purified by Soxhlet extraction by washing subsequently with acetone, hexanes and chloroform. The polymer was recovered in the chloroform fraction ($M_n$=24 kDa and PDI=2.08).

Example 6

P(BDT-FTT(E)), (100% FTT(E)): Monomers distannyl-BDT (0.115 g, 0.127 mmol)) and dibromo-FTT(E) (0.060 g, 0.127 mmol) were combined in a Schlenk flask with Pd(PPh$_3$)$_4$ (7 mg) in toluene (4 mL) and DMF (1 mL). The solution was heated to 115° C. and stirred for 96 h. The solution was poured into 100 mL methanol and the polymer was collected by filtration. The polymer was purified by Soxhlet extraction by washing subsequently with acetone, hexanes and chloroform. The polymer was recovered in the chloroform fraction ($M_n$=24 kDa and PDI=2.1).

Example 7

P((BDT-FTT(E))$_{0.25}$-(BDT-FTT(K1))$_{0.75}$): Monomers distannyl-BDT (0.10 g, 0.11 mmol)), dibromo-FTT(E) (13 mg, 0.0275 mmol) and dibromo-FTT(K1) (36.5 mg, 0.0825 mmol) were combined in a Schlenk flask with Pd(PPh$_3$)$_4$ (12.8 mg) in toluene (4.4 mL) and DMF (1.1 mL). The solution was heated to 120° C. and stirred for 48 h. The solution was poured into 100 mL methanol and the polymer was collected by filtration. The polymer was purified by Soxhlet extraction by washing subsequently with acetone, hexanes and chloroform. The polymer was recovered in the chloroform fraction ($M_n$=41 kDa and PDI=2.9).

Example 8

P((BDT-FTT(E))$_{0.5}$-(BDT-FTT(K1))$_{0.5}$) Monomers distannyl-BDT (100 mg, 0.11 mmol)), dibromo-FTT(E) (26 mg, 0.055 mmol) and dibromo-FTT(K1) (24 mg, 0.055 mmol) were combined in a Schlenk flask with Pd(PPh$_3$)$_4$ (13 mg) in toluene (4.4 mL) and DMF (1.1 mL). The solution was heated to 120° C. and stirred for 48 h. The solution was poured into 100 mL methanol and the polymer was collected by filtration. The polymer was purified by Soxhlet extraction by washing subsequently with acetone, hexanes and chloroform. The polymer was recovered in the chloroform fraction ($M_n$=29.6 kDa and PDI=2.9).

Example 9

P((BDT-FTT(E))$_{0.75}$-(BDT-FTT(K1))$_{0.25}$) Monomers distannyl-BDT (100 mg, 0.11 mmol)), dibromo-FTT(E) (39 mg, 0.0825 mmol) and dibromo-FTT(K1) were combined in a Schlenk flask with Pd(PPh$_3$)$_4$ (13 mg) in toluene (4.4 mL) and DMF (1.1 mL). The solution was heated to 120° C. and stirred for 48 h. The solution was poured into 100 mL methanol and the polymer was collected by filtration. The polymer was purified by Soxhlet extraction by washing subsequently with acetone, hexanes and chloroform. The polymer was recovered in the chloroform fraction ($M_n$=20 kDa and PDI=2.43).

Example 10

P((BDT-FTT(E))$_{0.5}$-(BDT-FTT(K2))$_{0.5}$) Monomers distannyl-BDT (100 mg, 0.11 mmol)), dibromo-FTT(E) (26 mg, 0.055 mmol) and dibromo-FTT(K2) (21 mg, 0.055 mmol) were combined in a Schlenk flask with Pd(PPh$_3$)$_4$ (7 mg) in toluene (4.4 mL) and DMF (1.1 mL). The solution was heated to 120° C. and stirred for 48 h. The solution was poured into 100 mL methanol and the polymer was collected by filtration. The polymer was purified by Soxhlet extraction by washing subsequently with acetone, hexanes and chloroform. The polymer was recovered in the chloroform fraction ($M_n$=23 kDa and PDI=1.4).

Example 11

P((BDT-FTT(P))$_{0.5}$-(BDT-FTT(K1))$_{0.5}$) Monomers distannyl-BDT (0.185 g, 0.21 mmol)), dibromo-FTT(P) (42 mg, 0.10 mmol) and dibromo-FTT(K1) (44 mg, 0.10 mmol) were combined in a Schlenk flask with Pd(PPh$_3$)$_4$ (32 mg) in toluene (9 mL) and DMF (3 mL). The solution was heated to 120° C. and stirred for 48 h. The solution was poured into 100 mL methanol and the polymer was collected by filtration. The polymer was purified by Soxhlet extraction by washing subsequently with acetone, hexanes and chloroform. The polymer was recovered in the chloroform fraction ($M_n$=16 kDa and PDI=1.9).

Example 12

Synthesis of P((BDT-FTTM)$_{0.25}$-(BDT-FTTE)$_{0.75}$): In a 50 mL Schlenk flask, BDTE (150.0 mg, 0.166 mmol) and FTTE (55.93 mg, 0.118 mmol) and FTTM (14.77 mg, 0.039 mmol) and Pd(PPh$_3$)$_4$ (18.3 mg, 0.016 mmol) were added. The mixture was vacuumed and backfilled with argon twice before 7.5 mL of anhydrous toluene and 1.5 mL of anhydrous dimethylformamide were added. The solution was frozen by liquid nitrogen and then vacuumed, backfilled with argon and thawed twice before heated to 120° C. for 20 hours. The product was precipitated out in 40 mL methanol and purified by Soxhlet extraction, methanol (16 hour), acetone (8 hour), hexane (16 hour) and dichloromethane (4 hour) and then chloroform 2 hour. The portion from dichloromethane was the main product (62 mg, yield 43.1%) after precipitated from methanol and then dried overnight.

Example 13

Synthesis of P((BDT-FTTM)$_{0.5}$-(BDT-FTTE)$_{0.5}$): In a 50 mL Schlenk flask, BDTE (100.0 mg, 0.106 mmol) and FTTE (24.86 mg, 0.053 mmol) and FTTM (19.69 mg, 0.053 mmol) and Pd(PPh$_3$)$_4$ (12.2 mg, 0.011 mmol) were added. The mixture was vacuumed and backfilled with Argon twice before 7.5 mL of anhydrous toluene and 1.5 mL of anhydrous dimethylformamide were added. The solution was frozen by liquid nitrogen and then vacuumed, backfilled with Argon and thawed twice before heated to 120° C. for 20 hours. The product was precipitated out in 40 mL methanol and purified by Soxhlet extraction, methanol (16 hour), acetone (8 hour), hexane (16 hour) and dichloromethane (4 hour) and then chloroform 2 hour. The portion from dichloromethane was the main product (60 and 24 mg respectively, yield 60.0%) after precipitated from methanol and then dried overnight.

Example 14

Synthesis of P((BDT-FTTM)$_{0.75}$-(BDT-FTTE)$_{0.25}$): In a 50 mL Schlenk flask, BDTE (150.0 mg, 0.166 mmol) and FTTE (18.65 mg, 0.039 mmol) and FTTM (44.3, 0.118 mmol) and Pd(PPh$_3$)$_4$ (18.3 mg, 0.016 mmol) were added. The mixture was vacuumed and backfilled with Argon twice before 7.5 mL of anhydrous toluene and 1.5 mL of anhydrous dimethylformamide were added. The solution was frozen by liquid nitrogen and then vacuumed, backfilled with Argon and thawed twice before heated to 120° C. for 20 hours. The product was precipitated out in 40 mL methanol and purified by Soxhlet extraction, methanol (16 hour), acetone (8 hour), hexane (16 hour) and dichloromethane (4 hour) and then chloroform 2 hour. The portion from chloroform was the main product (116 mg, yield 85.5%) after precipitated from methanol and then dried overnight.

In closing, it should be noted that the discussion of any reference is not an admission that it is prior art to the present invention, especially any reference that may have a publication date after the priority date of this application. At the same time, each and every claim below is hereby incorporated into this detailed description or specification as an additional embodiment of the present invention.

Device Fabrication and Measurement

ZnO sol-gel was prepared by dissolving zinc acetate dihydrate (220 mg, 1 mmol) and ethanolamine (62 mg, 1 mmol) into 2-methoxyethanol (2 mL) and stirred for 1 h in air. ITO-coated glass substrates were washed with detergent (15 min), DI water (2×15 min), acetone (15 min), and isopropanol (15 min) in an ultrasonication bath. The substrates were placed in a vacuum oven at 80° C. for 2 h and placed in a UV-ozone cleaner for 15 minutes. After filtration with a 0.2 µm PVDF syringe filter, ZnO sol-gel was spin-coated onto the top of the ITO substrate at 5000 rpm for 30 s (acceleration 5000 rpm). The substrate was annealed at 170° C. in air for 15 min and taken into glove box for deposition of the active layer. At the same time, 10 mg of P(BDT-FTT) and 16 mg of PC$_{70}$BM were mixed in ortho-xylene (1 mL) and stirred at 100° C. for 12 h. Diiodooctane (25 µL) was added to the solution and stirred for an additional 1 h, followed by filtration through a 0.45 µm PTFE syringe filter. Afterwards, the solution was coated on the substrate at 1,800, 2,000, and 2,200 rpm for 20 s. The substrate was solvent annealed inside of glass dishes for 1 h. After solvent annealing, the substrate was scratched at the edge to expose the ITO layer for the metal deposition. The substances were placed in the metal evaporator, and 14 nm of MoO$_3$ and 100 nm of Ag were deposited. The deposition speed for the MoO$_3$ was 0.5 Å/s. The deposition speed for Ag started at 0.5 Å/s until 5 nm was deposited. Afterward, the speed increased to 1-1.5 Å/s until 100 nm was deposited. The devices were encapsulated using UV-curable epoxy and a cover glass, and exposed to UV cure for 10 min.

The current density-voltage (J-V) curves were measured using a Keithley 2400 source meter. The photocurrent was measured under AM 1.5 G illumination at 100 mW/cm$^2$ under Newport Thermal Oriel 91192 1000 W solar simulator (4"×4" beam size). The light intensity was calibrated by a mono-silicon detector (with KG-5 visible color filter) calibrated by National Renewable Energy Laboratory to minimize spectral mismatch.

Table 1 depicts the solar cell performance of polymers from Examples 1-6.

| Examples | FTT(E):FTT(P) ratio | $V_{oc}$ (V) | $J_{sc}$ (mA/cm$^2$) | Fill Factor (%) | PCE (%) | $R_s$ (Ω · cm$^2$) | $R_{sh}$ (Ω) |
|---|---|---|---|---|---|---|---|
| 1 | 0:1 | 0.740 | 17.3 | 62.4 | 7.99 | 4.6 | 5723 |
| 2 | 0.3:0.7 | 0.75 | 16.5 | 65.0 | 8.07 | 4.6 | 9412 |
| 3 | 0.5:0.5 | 0.77 | 16.5 | 70.1 | 8.90 | 3.4 | 9286 |
| 4 | 0.7:0.3 | 0.76 | 16.1 | 61.1 | 7.48 | 5.0 | 5547 |
| 5 | 0.9:0.1 | 0.80 | 14.5 | 65.5 | 7.60 | 5.2 | 7567 |
| 6 | 1:0 | 0.80 | 16.0 | 68.6 | 8.74 | 4.1 | 10504 |

Table 2 depicts the solar cell performance of polymers from Examples 7-9.

| Polymer | FTT(E):FTT(K1) ratio | $V_{oc}$ (V) | $J_{sc}$ (mA/cm$^2$) | Fill Factor (%) | PCE (%) | $R_s$ (Ω · cm$^2$) | $R_{sh}$ (Ω · cm$^2$) |
|---|---|---|---|---|---|---|---|
| Example 7 | 0.25:0.75 | 0.81 | 15.89 | 59.95 | 7.72 | 7.25 | 620 |
| 8 | 0.5:0.5 | 0.77 | 17.29 | 64.79 | 8.26 | 5.19 | 779 |
| 9 | 0.75:0.25 | 0.79 | 16.83 | 67.84 | 9.04 | 4.34 | 815 |

Table 3 depicts the solar cell performance of polymers from Example 10.

| Polymer | FTT(E):FTT(K2) ratio | $V_{oc}$ (V) | $J_{sc}$ (mA/cm$^2$) | Fill Factor (%) | PCE (%) | $R_s$ ($\Omega \cdot$ cm$^2$) | $R_{sh}$ ($\Omega \cdot$ cm$^2$) |
|---|---|---|---|---|---|---|---|
| Example 10 | 0.5:0.5 | 0.79 | 17.3 | 68 | 9.30 | 2.8 | 956 |

Table 4 depicts the solar cell performance of polymers from Example 11.

| Polymer | FTT(P):FTT(K1) ratio | $V_{oc}$ (V) | $J_{sc}$ (mA/cm$^2$) | Fill Factor (%) | PCE (%) | $R_s$ ($\Omega \cdot$ cm$^2$) | $R_{sh}$ ($\Omega \cdot$ cm$^2$) |
|---|---|---|---|---|---|---|---|
| Example 11 | 0.5:0.5 | 0.81 | 15.77 | 63.49 | 8.11 | 4.97 | 713 |

Example 12

The polymer derivative of example 3 was further optimized in devices. A device structure was used which included a [6,6]-phenyl C61 butyric acid 2-hydroxyethyl ester (PCBE-OH) doped ZnO film as a interfacial layer. The resulting solar cell performance is depicted in FIG. 1 and Table 5 below. The $V_{oc}$ for this device slightly higher compared to the above fabrication method, and the $J_{sc}$ increases to 17.4 mA/cm$^2$.

TABLE 5

| Polymer | Device Structure | $V_{oc}$ (V) | $J_{sc}$ (mA/cm$^2$) | Fill Factor (%) | PCE (%) | $R_s$ ($\Omega \cdot$ cm$^2$) | $R_{sh}$ ($\Omega \cdot$ cm$^2$) |
|---|---|---|---|---|---|---|---|
| Example 3 | ITO/ZnO/ZnO-PCBOH/active layer/MoO$_3$/Ag | 0.79 | 17.4 | 69.0 | 9.46 | 3.7 | 731 |

TABLE 6

| Polymer | Monomer ratio | | | $V_{oc}$ (V) | $J_{sc}$ (mAcm$^{-2}$) | FF (%) | PCE (%) |
|---|---|---|---|---|---|---|---|
| | FTTM | FTTE | BDTE | | | | |
| Example 6 | 0 | 100 | 100 | 0.80 | 15.2 | 68.8 | 8.38 |
| Example 12 | 25 | 75 | 100 | 0.78 | 14.6 | 62.7 | 7.12 |
| Example 13 | 50 | 50 | 100 | 0.77 | 16.6 | 72.1 | 9.15 |
| Example 14 | 75 | 25 | 100 | 0.72 | 16.8 | 58.7 | 7.18 |

In closing, it should be noted that the discussion of any reference is not an admission that it is prior art to the present invention, especially any reference that may have a publication date after the priority date of this application. At the same time, each and every claim below is hereby incorporated into this detailed description or specification as an additional embodiment of the present invention.

Although the systems and processes described herein have been described in detail, it should be understood that various changes, substitutions, and alterations can be made without departing from the spirit and scope of the invention as defined by the following claims. Those skilled in the art may be able to study the preferred embodiments and identify other ways to practice the invention that are not exactly as described herein. It is the intent of the inventors that variations and equivalents of the invention are within the scope of the claims while the description, abstract and drawings are not to be used to limit the scope of the invention. The invention is specifically intended to be as broad as the claims below and their equivalents.

The invention claimed is:

1. A polymer having two different sets of repeat units consisting essentially of:

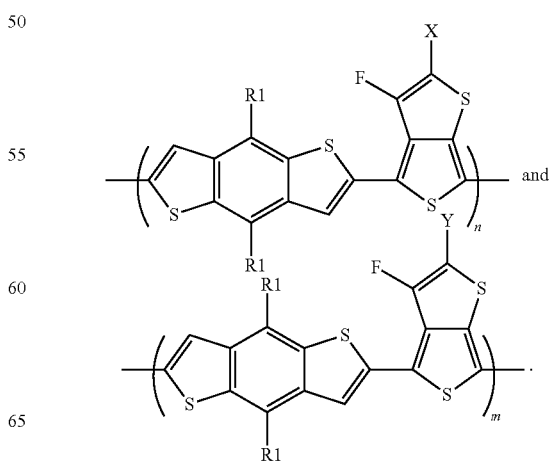

wherein the two sets of repeat units are a benzo[1,2-b:4,5-b']dithiophene with a 2-ethylhexyl substituted 3-fluorothieno[3,4-b]thiophene and a benzo[1,2-b:4,5-b']dithiophene with a propyl substituted 3-fluorothieno[3,4-b]thiophene

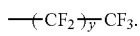

2. The polymer of claim 1, wherein the aryl groups comprise of heterocycles and fused heterocycles.

3. The polymer of claim 1, wherein the polymer is regio-regular.

4. The polymer of claim 1, wherein the polymer is regio-random.

5. The polymer of claim 1, wherein the polymer is used as photovoltaic material in one or more photovoltaic devices.

6. The polymer of claim 5, wherein the one or more photovoltaic devices are polymer solar cell devices or photodetector devices.

7. The polymer of claim 1, wherein the polymer is used as active layer material in one or more electronic devices.

8. The polymer of claim 7, wherein the one or more electronic devices are field effect transistors, light emitting devices, and sensors, electrochromic devices and capacitors.

9. The polymer of claim 1, wherein the ratio of

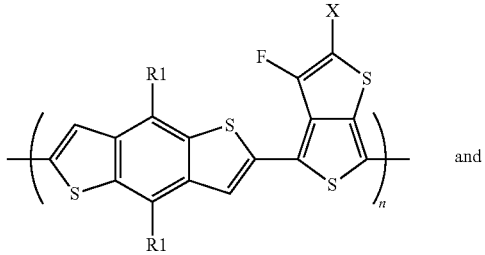

and

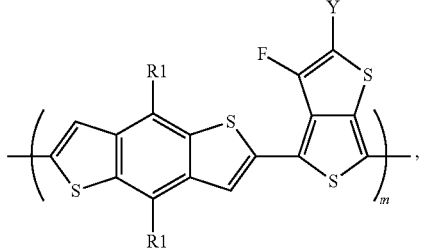

in the polymer is around 50:50.

10. The polymer of claim 1, wherein the two sets of repeat units are a benzo[1,2-b:4,5-b']dithiophene with a 2-ethylhexyl substituted 3-fluorothieno[3,4-b]thiophene and a benzo[1,2-b:4,5-b']dithiophene with a propyl substituted 3-fluorothieno[3,4-b]thiophene in a ratio of around 50:50.

11. A polymer having two different sets of repeat units consisting essentially of:

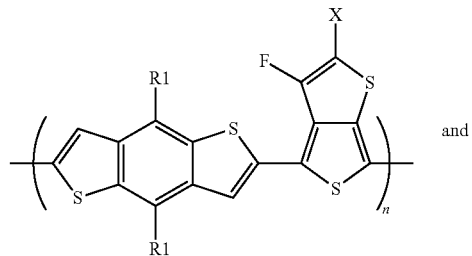

and

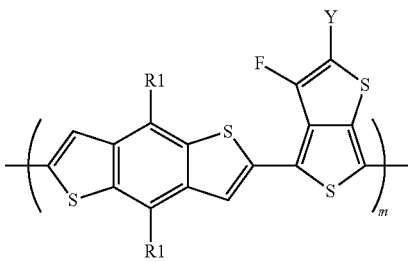

wherein the two sets of repeat units are a 2-ethyl-1-(3-fluorothieno[3,4-b]thiophen-2-yl)hexan-1-one and a 1-(3-fluorothieno[3,4-b]thiophen-2-yl)butan-1-one

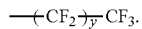

* * * * *